US006100639A

United States Patent [19]

Sverdrup, Jr. et al.

[11] Patent Number: 6,100,639

[45] Date of Patent: Aug. 8, 2000

[54] THIN DIAMOND ELECTRON BEAM AMPLIFIER FOR AMPLIFYING AN ELECTRON BEAM AND METHOD OF PRODUCING AN AMPLIFIED ELECTRON BEAM USING SAME

[75] Inventors: Lawrence H. Sverdrup, Jr., Poway; Shiow-Hwa Lin; Eric J. Korevaar, both of San Diego, all of Calif.

[73] Assignee: ThermoTrex Corporation, San Diego, Calif.

[21] Appl. No.: 08/899,399

[22] Filed: Jul. 22, 1997

Related U.S. Application Data

[63] Continuation of application No. 08/513,169, Aug. 9, 1995.

[51] Int. Cl.[7] ........ H03F 3/54

[52] U.S. Cl. ........ 315/169.3; 330/44

[58] Field of Search ........ 315/169.3, 160, 315/161, 167; 345/55, 76; 330/44

[56] References Cited

U.S. PATENT DOCUMENTS

| | | | |
|---|---|---|---|
| 3,922,616 | 11/1975 | Weiner | 330/44 |
| 4,577,133 | 3/1986 | Wilson | 313/103 CM |
| 4,990,766 | 2/1991 | Simms et al. | 250/213 |
| 4,993,033 | 2/1991 | Lin . | |
| 5,052,006 | 9/1991 | Phillips . | |
| 5,138,237 | 8/1992 | Kane et al. | 315/349 |
| 5,252,853 | 10/1993 | Kane et al. . | |
| 5,355,093 | 10/1994 | Treado et al. | 330/45 |
| 5,410,158 | 4/1995 | Kane et al. . | |
| 5,420,443 | 5/1995 | Dreifus et al. | 257/77 |

*Primary Examiner*—David Vu

*Attorney, Agent, or Firm*—Fish & Richardson PC

[57] ABSTRACT

A thin diamond electron beam amplifier. The illumination side of a thin diamond is illuminated by a seed electron beam creating electron-hole pairs in the diamond. A voltage potential provides an electric field between the illumination side of the diamond and an acceleration grid opposite the emission side of the diamond. Electrons released in the diamond are accelerated through the emission side of the diamond toward the acceleration grid creating an amplified electron beam. Preferred embodiments of the present invention are useful to provide flat panel displays and replacements for thermionic cathodes.

9 Claims, 6 Drawing Sheets

THIN DIAMOND ELECTRON BEAM AMPLIFIER FOR AMPLIFYING AN ELECTRON BEAM AND METHOD OF PRODUCING AN AMPLIFIED ELECTRON BEAM USING SAME

This is a continuation of copending application Ser. No. 08/513,169, filed Aug. 9, 1995.

The present invention relates to amplifiers and in particular to electron beam amplifiers.

BACKGROUND OF THE INVENTION

Diamond is an excellent electrical insulator; however, it is known that diamond can be made to conduct electrical current when illuminated with a beam of electrons. One of the applicants (Lin) has patented a diamond switch (U.S. Pat. No. 4,993,033 issued Feb. 12, 1991) in which a diamond target conducts electrical current in an electrical circuit when the diamond target is illuminated by electrons from an electron emitting surface. The teachings of this patent are incorporated herein by reference.

Field emission electronic devices are well known. In U.S. Pat. No. 5,355,093 issued to Treado and Lin on Oct. 11, 1994, an electronic amplifier circuit was described in which a microwave signal stimulated a gated field emission array to emit a modulated electron beam which in turn illuminated a diamond in a diamond switch to produce an amplified microwave signal in the amplifier circuit. The teachings of that patent are also incorporated herein by reference.

Flat panel display devices are relatively new but they have recently become big business. The January issue of Photonics Spectra predicts that the market for flat panel displays will reach $20 billion by the year 2000. Active matrix liquid crystal display (AMLCO) devices for about 87% of flat panel display sales in 1995. According to the May 1993 issue of IEEE Spectrum field emitter devices accounted for 0.1% of the world market in flat panel display devices. Prior art FED devices are described in "Beyond AMLCD's: Field Emission's Displays?" in the November 1994 issue of Solid State Technology which article is incorporated herein by reference.

FIG. 1 describes a typical FED device. Electrons are liberated from emitter 2 on cathode plate 4 and the electrons are accelerated (by an electrical potential between cathode plate 4 and electrode layer 10) toward phosphor layer 6 on face plate 8. Voltage applied to gates 12 control electron flow and thus the brightness of individual pixel areas of phosphor layer 6. Phosphor layer 6 and electrode layer 10 are mounted on glass faceplate 8.

Most FED's must be operated at very high vacuum, not only to provide long mean free paths but to maintain a clean environment for the emitters. Electrode plates are typically metals and various techniques have been developed to produce emitter tips in order to increase electron flow from the electrode plate. A serious problem with current FED's is that reverse ion bombardment from the phosphor damages the emitter tips. Another problem is that electric fields near breakdown limits are required for the desired current output resulting in reduced lifetime of the emitter array.

What is needed is a simple device for amplifying an electron beam.

SUMMARY OF THE INVENTION

The present invention provides a thin diamond electron beam amplifier. The illumination side of a thin diamond is illuminated by a seed electron beam creating electron-hole pairs in the diamond. A voltage potential provides an electric field between the illumination side of the diamond and an acceleration grid opposite the emission side of the diamond. Electrons released in the diamond are accelerated through the emission side of the diamond toward the acceleration grid creating an amplified electron beam. Preferred embodiments of the present invention are useful to provide flat panel displays and replacements for thermionic cathodes.

DETAILED DESCRIPTION OF PREFERRED EMBODIMENTS

Figure 1:
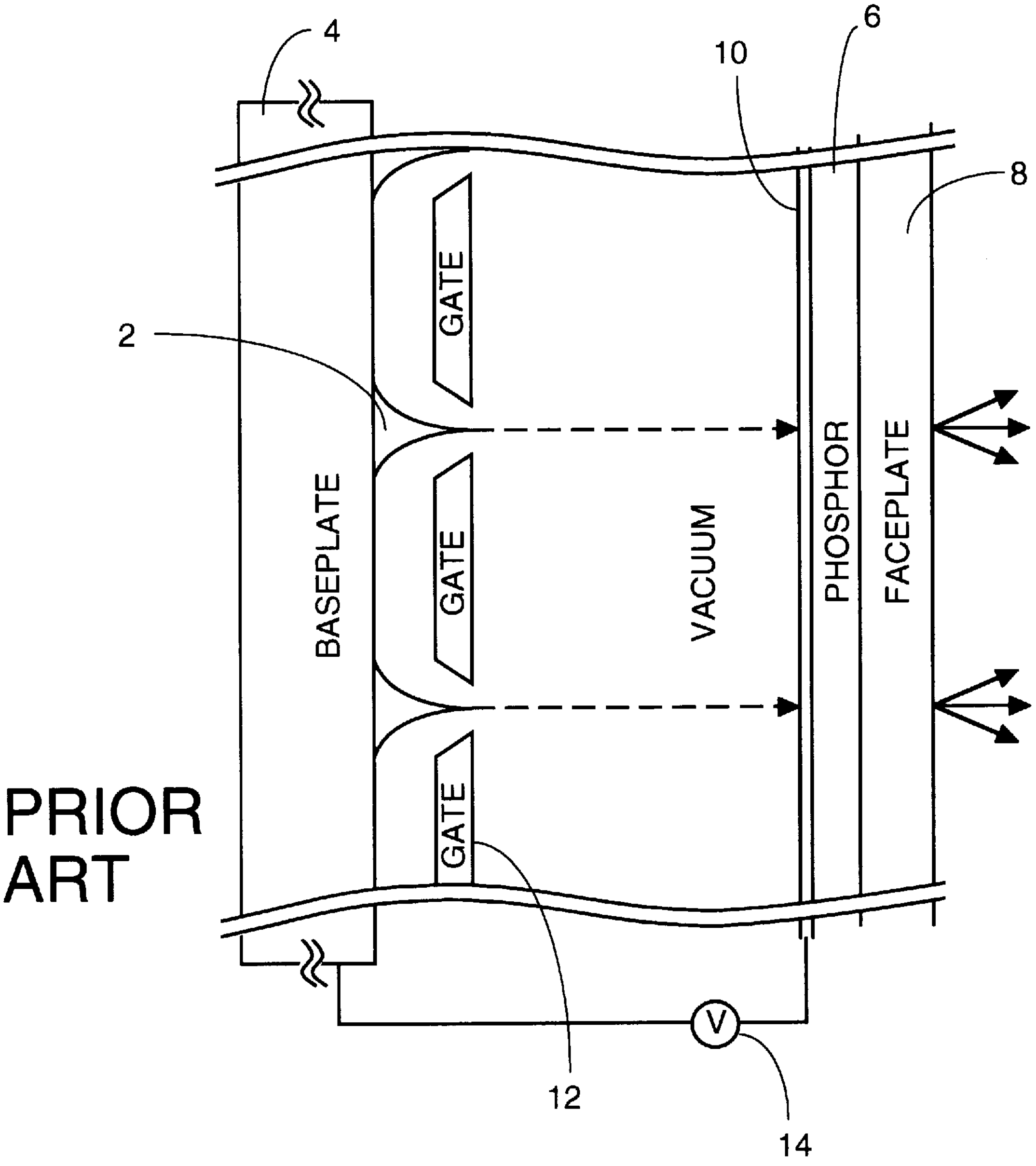
FIG. 1 shows a prior art FED.

The present invention can be described by reference to the drawing.

Figure 2:
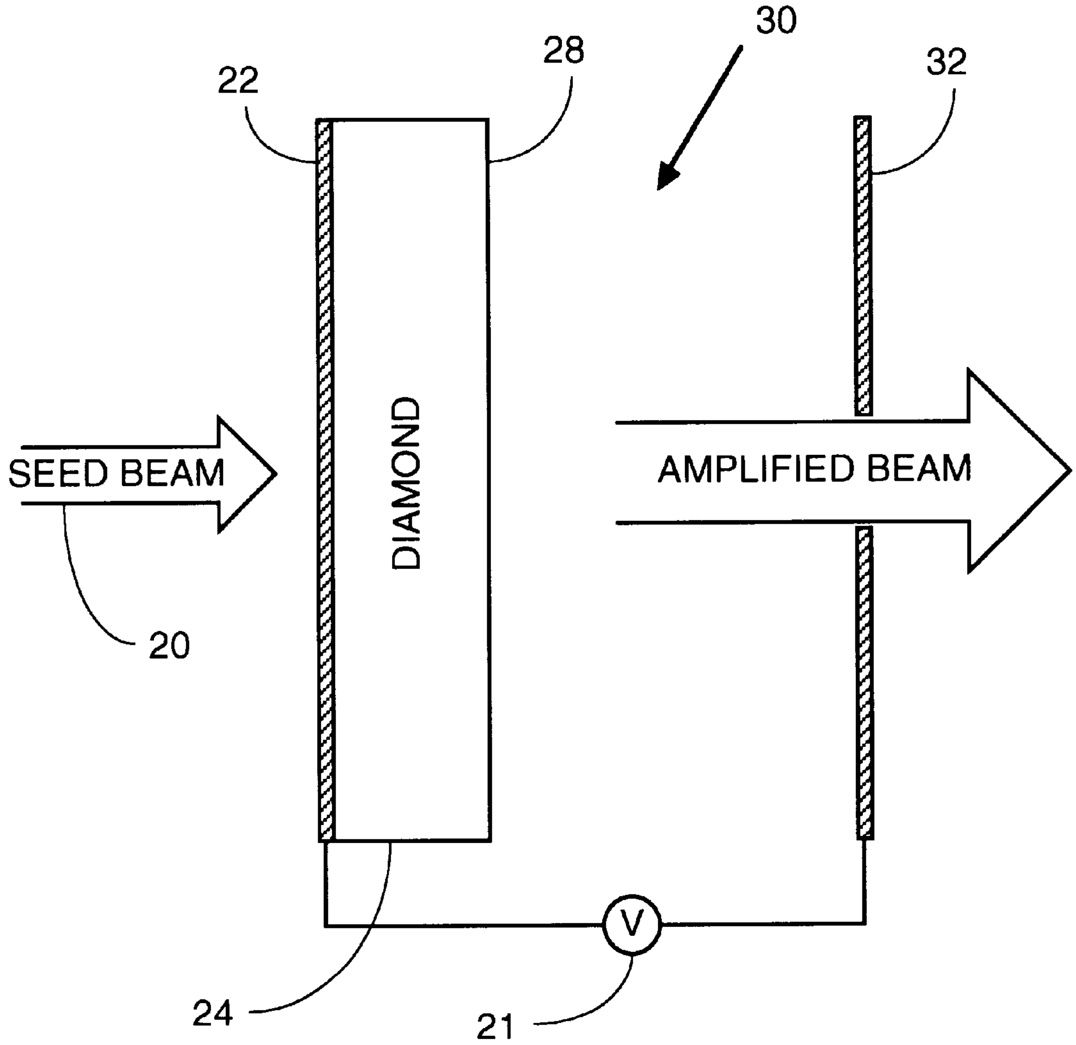
FIG. 2 describes one embodiment of the present invention.
Figure 3:
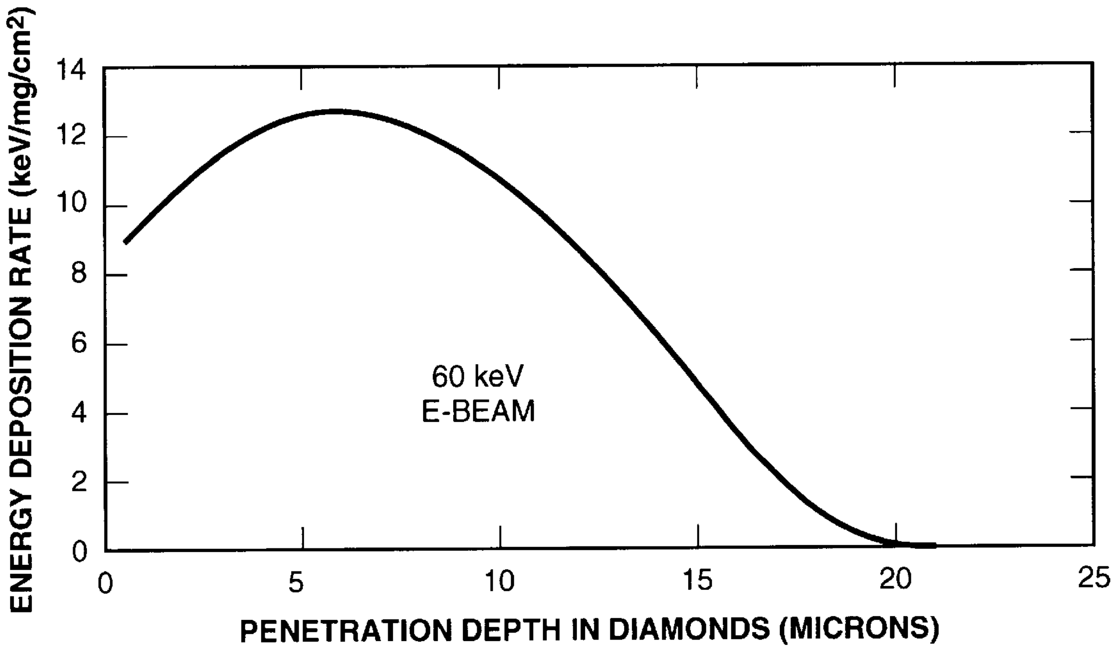
FIG. 3 shows 60 keV electron penetration depth in diamond.

FIG. 2 is a simple drawing showing elements and describing the function of the present invention. Low current electron beam 20 passes through electron transparent electrode 22 to illuminate very thin diamond 24. As the electrons in beam 20 interact with atoms in diamond 24, about one electron-hole pair is created for each 16.5 eV of energy in beam 20. The thickness of diamond 24 is preferably matched to the energy of electrons in beam 20 such that electrons in beam 20 fully penetrate diamond 24. FIG. 3 shows the energy deposition rate as a function of diamond thickness for a 60 keV electron beams. Thus, for a 60 keV electron beam a diamond thickness of about 15 microns would be recommended. Thinner diamond wafers would be matched with lower energy electron beam. For example 1 $\mu$m thick diamond would be matched with 10 keV electrons. Diamond 24 is fabricated to provide a very small or negative electron affinity (NEA) at exit surface 28. This means there is a very small or zero barrier for electrons leaving diamond 24 and passing into vacuum space 30.

An electric field between transparent electrode 22 and acceleration grid 32 is provided by a voltage source 21. By providing a small vacuum space 30, a very high electric field can be provided with a modest voltage. A good combination is a 100 micron space and a potential of 1,000 volts to produce a field of about 10 kv/cm in the vacuum region of the diode.

A portion of the electrons generated in diamond 24 are drawn out of diamond 24 by the electric field to create an amplified beam. For example, the theoretical current gain produced by a 10 keV electron could be as high as about 600. Thus, an illumination current of 1.7 mA could theoretically produce an output current of 1000 mA (i.e, one amp.).

PROOF OF PRINCIPLE EXPERIMENT

Figure 4:
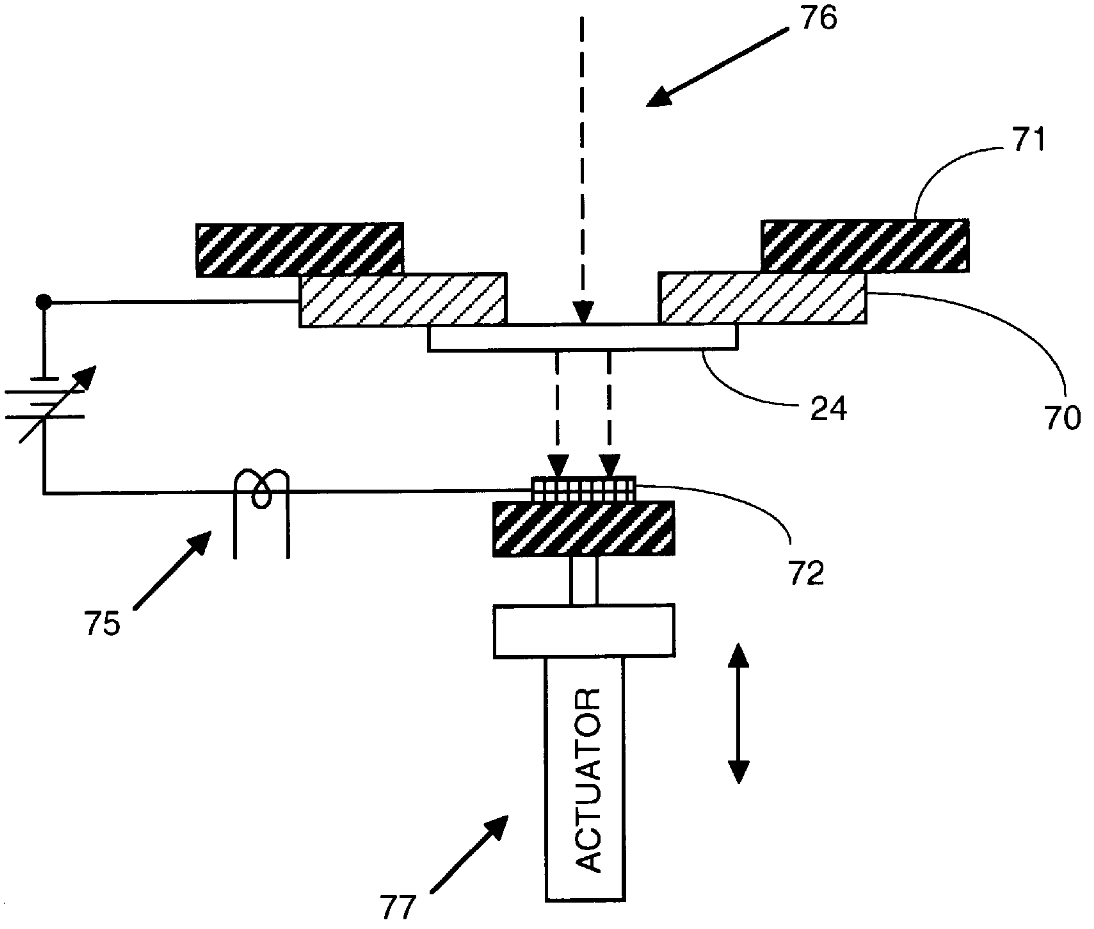
FIG. 4 shows a proof of principal set-up.

A diode assembly was constructed by Applicants to demonstrate the electron bombarded diamond cathode concept. The structure is schematically shown in FIG. 4. It consisted of a 10–15 $\mu$m thick (the exact thickness was not measured), natural type IIa diamond wafer 24 mounted on cathode 70. Cathode holder 70 made of a thin electroplated graphite plate. Cathode holder 70 in turn was mounted on insulator 71. A one millimeter diameter hole was drilled in the middle of the cathode holder so that the primary electron beam can bombard diamond 24. Anode 72 was also made of graphite, but with no gold plating. Graphite is selected for the anode because of its low secondary electron emission coefficient.

The diamond wafer 24 was coated on one side only with thin layers of metals which serve as the electrical contact to the cathode holder. Typical materials used for this metallization are tungsten with gold overcoat. The thickness of these layers were 500 Å/1500 Å each. The diamond wafer was placed inside a hydrogen plasma for surface termination treatment.

The diode assembly was placed into a vacuum chamber containing an electron gun. The typical chamber vacuum condition where these experiments were performed was $2–3\times10^{-6}$ torr.

The electron gun generated a low current electron beam (up to 20 mA) with electron energies variable from 30 to 55 kV. The electron beam was allowed to focus and move around so that most of the beam was impinging on the metalized side of the diamond. The bombarding electron beam penetrated into the diamond target generating multiple electron-hole pairs which caused the diamond target to become electrically conductive. Current was monitored by monitor 75. The gap between anode 72 and diamond 24 was controlled by actuator 77.

The electrons then drift toward the uncoated (emission) side under the influence of the applied electric field. Some of these electrons are recombined with holes before they reach the emission side. The recombination process reduces the number of the electrons available for emission into vacuum. The higher the applied field strength, the lower the recombination loss. The field strength is limited by the breakdown between the cathode and anode surfaces, in the experiment the applied voltage was limited to 150 V. The anode to cathode distance in the experiment could not be measured accurately, but was estimated to be 100 to 150 $\mu$m. Therefore the average field in the diode region was only 1–1.5 V/$\mu$m.

At lower electron energy the electron emission current was very small. But with increasing primary electron energy, more and more electron emission was observed. Current densities exceeding 20A/cm$^2$ were generated and were consistent with a Child's Law limitation.

NEGATIVE ELECTRON AFFINITY

It is important that the emission side of the diamond have a low and preferably negative electron affinity. It has been predicted that the <111> and <100> surface of diamond, when hydrogen terminated exhibit negative electron affinity. Experiments by applicants support a conclusion of negative electron affinity by hydrogen terminated <111> diamond surface. Cesium is knower to exhibit a NEA, but is a highly reactive chemically. Diamond on the other hand is very stable. Applicant's experiments have shown that diamond emission in not degraded by air or moisture.

FIELD EMISSION FLAT PANEL DISPLAYS

A potential major application of this concept lies in field-emission flat panel displays. In this instance, conventional field emitter cathodes are used to illuminate with a beam of electrons a diamond cathode which amplifies the current in the beam. In doing so, the primary field emitters are insulated from exposure to the output phosphor by a piece of diamond film which is chemically robust. Reverse ion-bombardment associated with the phosphor and its gas load is eliminated. In addition, the requirements on the primary field emitters are drastically reduced, as smaller emission currents are required. Typically, to get the necessary current without subsequent amplification, electric fields near the breakdown limits are required and array lifetime is poor. With a bombarded-diamond-cathode amplifier the primary field emitter construction can be much more robust, resulting in improved emission and lifetime characteristics.

Experiments at TTC have demonstrated Child's law limited emission current densities of 20 amps/cm$^2$. Thus very large current densities can be emitted by diamond cathodes. Experiments are now under way to verify large current gain. In previous experiments without proper hydrogen surface termination, and with unknown surface orientation, current gains of 12 have been observed.

Figure 5:
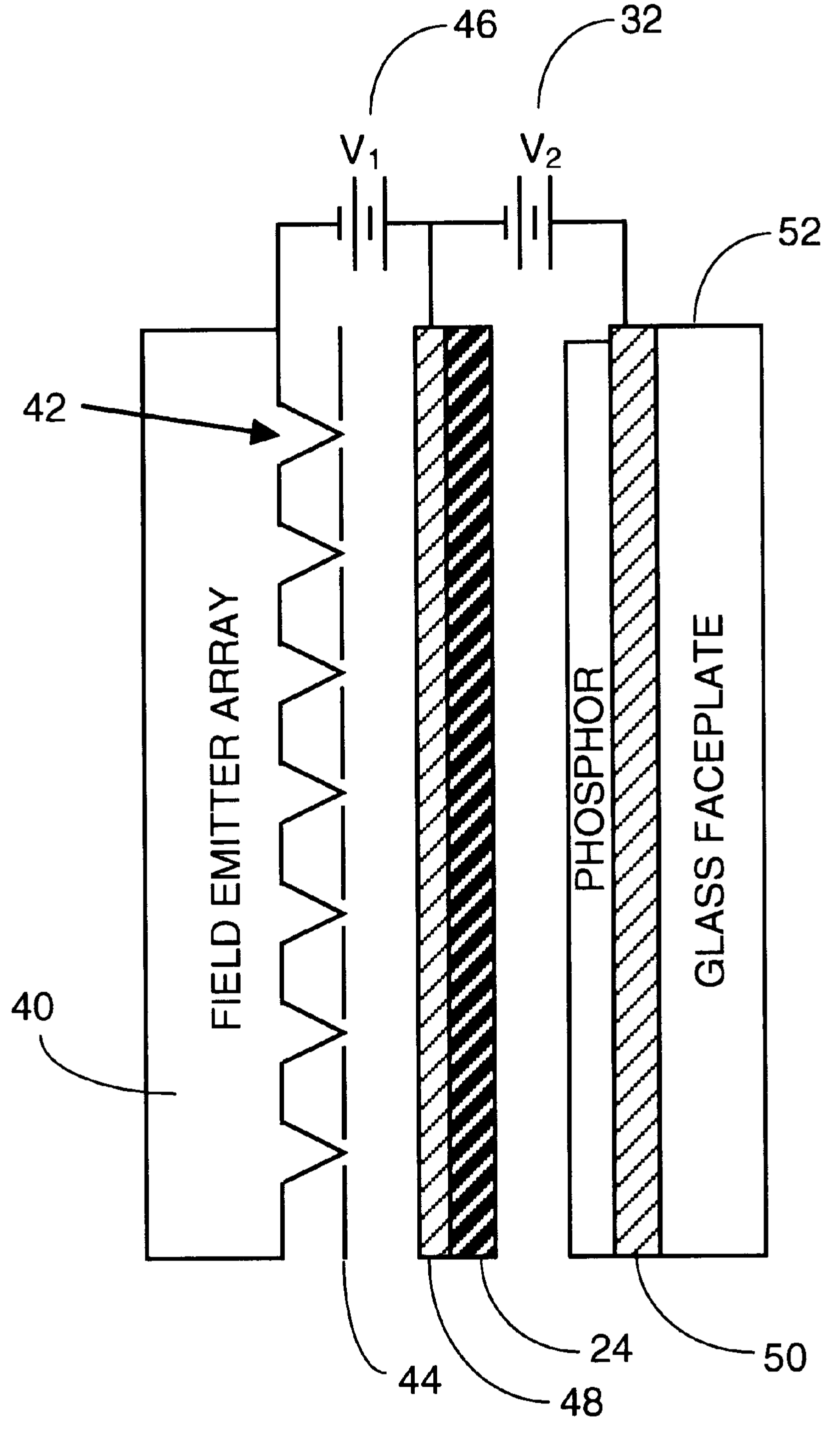
FIG. 5 shows the present invention applied to provide a flat panel display.

FIG. 5 is a drawing describing the present invention utilized to provide a flat panel display. A prior art field emitter array 40 with emitter tips 42 provides a spatially varying seed current controlled by gates 44. Voltage source 46 accelerates electrons from array 40 toward anode 48 and into diamond 24 where the electron creates multiple electron-hole pairs. Electrons are drawn out of diamond 24 by acceleration grid 32 into phosphor surface 50 to create a spatially varying display. The elements shown in FIG. 5 are mounted on glass faceplate 52. For flat panel displays we recommend use of diamonds produced by chemical vapor deposition (CVD diamonds). Such diamonds can be produced in large flat sheets with the appropriate thickness.

THERMIONIC CATHODE REPLACEMENT

Figure 6:
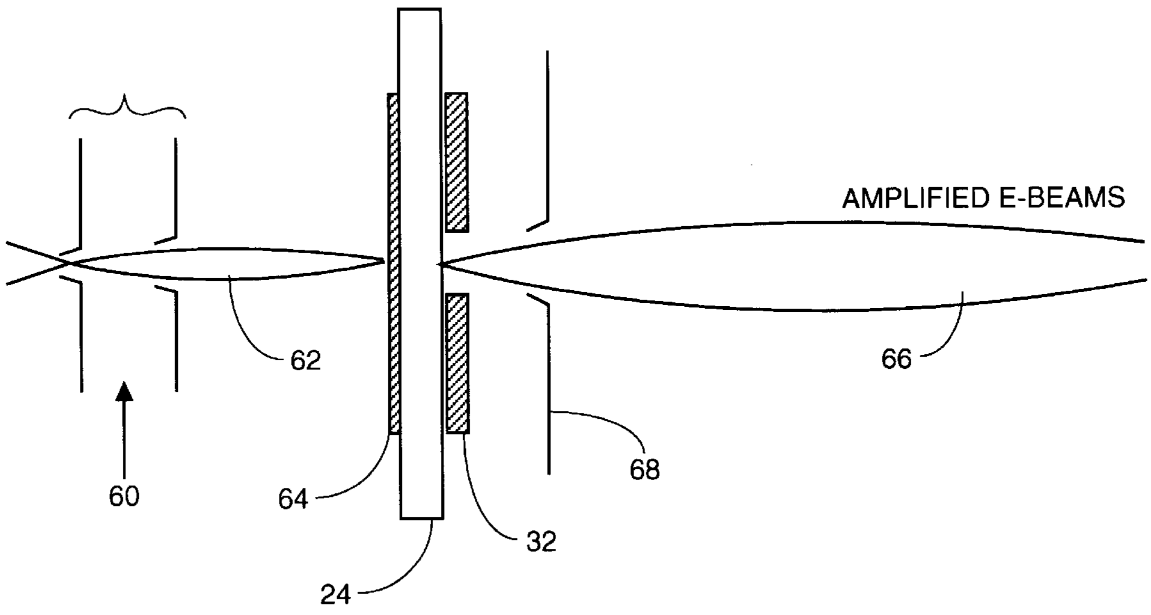
FIG. 6 shows a replacement for thermionic cathodes.

FIG. 6 shows an application of the present invention to replace thermionic cathodes which are high consumers of electric current due to the cathode heating power. A conventional low current field emitter 60 produces a low current electron beam 62 which is accelerated into diamond 24 by anode 64 producing electron-hole pairs. Electrons are drawn out of diamond 24 by acceleration grid 32 to produce amplified beam 66 which is focused by focusing grid 68.

The above descriptions do not limit the scope of this invention but are examples of preferred embodiments. Those skilled in the art will envision many possible variations which are within its scope. The scope of the invention is described by the following claims:

We claim:

1. A thin diamond electron beam amplifier for amplifying an electron beam comprising:

a) a thin diamond defining an illumination side and an emission side, b) an acceleration grid, spaced from said emission side, c) a voltage potential means for applying an electric field between said illumination side and said acceleration grid, wherein, when said illumination side of said diamond is illuminated by a first electron beam, electrons in said first electron beam create electron-hole pairs in said diamond and some of said created electrons are accelerated through said emission side to produce an amplified electron beam having higher current than said first electron beam.

2. An electron beam amplifier as in claim 1 wherein said emission side comprises a <111> diamond surface.

3. An electron beam amplifier as in claim 1 wherein said emission side comprises a <100> diamond surface.

4. An electron beam amplifier as in claim 1 wherein said emission side is hydrogen terminated.

5. An electron beam amplifier as in claim 1 and further comprising a field emission array to provide said first electron beam.

6. An electron beam amplifier as in claim 1 and further comprising a focusing grid configured to focus said amplifier electron beam.

7. An electron beam amplifier as in claim 1 wherein said thin diamond is a CVD diamond, either polycrystalline or monocrystalline.

8. An electron beam amplifier as in claim 1 wherein said thin diamond has a thickness such that said first electron beam defines a penetration depth in diamond matched approximately to said thickness.

9. A method, utilizing a thin diamond sheet defining an illumination side on an emission side of producing an amplified electron beam from a first electron beam comprising the steps of:

a) accelerating said first electron beam toward the illumination side of thin diamond sheet causing electrons in said first electron beam to produce electron-hole pairs in said thin diamond sheet, b) providing an electric field across said thin diamond sheet in order to cause electrons produced in said thin diamond sheet to be emitted from said emission side to produce said amplified electron beam.

* * * * *